United States Patent
Nonaka et al.

(10) Patent No.: US 9,365,924 B2
(45) Date of Patent: Jun. 14, 2016

(54) METHOD FOR FORMING FILM BY PLASMA-ASSISTED DEPOSITION USING TWO-FREQUENCY COMBINED PULSED RF POWER

(71) Applicant: ASM IP Holding B.V., Almere (NL)

(72) Inventors: Yuya Nonaka, Kawasaki (JP); Fumitaka Shoji, Kawasaki (JP); Hiroki Arai, Fuchu (JP)

(73) Assignee: ASM IP Holding B.V., Almere (NL)

( * ) Notice: Subject to any disclaimer, the term of this patent is extended or adjusted under 35 U.S.C. 154(b) by 372 days.

(21) Appl. No.: 13/901,400

(22) Filed: May 23, 2013

(65) Prior Publication Data

US 2014/0349033 A1    Nov. 27, 2014

(51) Int. Cl.
*C23C 16/515*  (2006.01)
*C23C 16/04*  (2006.01)
*C23C 16/509*  (2006.01)
*H01J 37/32*  (2006.01)

(52) U.S. Cl.
CPC ........... *C23C 16/045* (2013.01); *C23C 16/5096* (2013.01); *C23C 16/515* (2013.01); *H01J 37/32091* (2013.01); *H01J 37/32146* (2013.01); *H01J 37/32165* (2013.01)

(58) Field of Classification Search
CPC .................................................. C23C 16/515
See application file for complete search history.

(56) References Cited

U.S. PATENT DOCUMENTS

| | | | |
|---|---|---|---|
| 4,837,185 A | 6/1989 | Yau et al. | |
| 5,562,952 A * | 10/1996 | Nakahigashi | C23C 16/405 |
| | | | 118/50 |
| 6,413,583 B1 * | 7/2002 | Moghadam et al. | 427/249.15 |
| 7,211,524 B2 | 5/2007 | Ryu et al. | |
| 7,514,375 B1 * | 4/2009 | Shanker et al. | 438/788 |
| 2005/0227502 A1* | 10/2005 | Schmitt et al. | 438/788 |
| 2012/0121823 A1* | 5/2012 | Chhabra et al. | 427/585 |

* cited by examiner

*Primary Examiner* — Shamim Ahmed
*Assistant Examiner* — Bradford Gates
(74) *Attorney, Agent, or Firm* — Snell & Wilmer LLP

(57) ABSTRACT

A method for forming a dielectric film on a substrate by plasma-assisted deposition, includes: introducing a Si-containing process gas to a reaction space wherein a substrate having a surface with patterned recesses is placed; and applying RF power to the process gas in the reaction space to form a dielectric film on the surface by plasma reaction. The RF power is comprised of pulses of high-frequency RF power and pulses of low-frequency RF power, which overlap and are synchronized.

15 Claims, 5 Drawing Sheets

METHOD FOR FORMING FILM BY PLASMA-ASSISTED DEPOSITION USING TWO-FREQUENCY COMBINED PULSED RF POWER

BACKGROUND OF THE INVENTION

1. Field of the Invention

The present invention generally relates to plasma-assisted deposition, in particular to a method for forming a dielectric film by plasma-assisted deposition using two-frequency combined pulsed RF power.

2. Description of the Related Art

As device miniaturization progresses, dielectric constants of interlayer insulation films which insulate intercalation need to be lower. Ideally, air-gap structures having a dielectric constant of one (k=1) are used. However, even with the air-gap structures, sidewalls of patterned recesses facing each other via an air gap need to be covered by an insulation film having a certain thickness. Films formed on sidewalls of patterned recesses are typically thinner than those formed on top surfaces of the recesses, but it is required that the films be stable and dense so as not to be apt to change properties with time and not to release gas to the air gaps. A SiO film is typically used as an insulation film formed on sidewalls of patterned recesses, but the SiO films formed on the sidewalls by conventional plasma-enhanced CVD are porous and have a lower density and higher wet etch rate than those of films formed on the top surfaces.

When the films formed on sidewalls are porous films having high degassing, the air-gap structures are subject to defects such as expansion, cracking, etc. during subsequent processes using high temperature such as film deposition processes and CMP processes. Thus, the films formed on sidewalls need to have properties equivalent to or better than those of films formed on the top surfaces.

When a film is formed on patterned recesses of a substrate by plasma CVD, it can be confirmed that a film formed on a top surface of the recesses is thick whereas a film formed on sidewalls of the recesses is thin. This tendency depends upon the size of line spaces and the depth of lines, and the smaller the line space, and the greater the aspect ratio of the line, the lower the thickness of a film formed on the sidewalls becomes relative to the thickness of a film formed on the top surface. Further, the properties of a film formed on the sidewalls and a film formed on the top surface are different; the film formed on the top surface is dense and has good quality due to ion bombardment generated by a plasma, whereas the film formed on the sidewalls is porous and has a low density because the sidewalls receive less ion bombardment.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In some embodiments of the present invention, by using two-frequency combined pulsed RF power wherein the RF power is comprised of pulses of high-frequency RF power and pulses of low-frequency RF power, wherein the pulses of high-frequency RF power and the pulses of low-frequency RF power overlap and are synchronized, a step coverage of film can be improved in both an area where the distance between lines is narrow and an area where the distance between lines is wide, and a film formed on sidewalls of patterned recesses can become dense and the film quality can be improved, rendering less difference in film properties between the film formed on the top surface and the film formed on the sidewalls. In some embodiments, the wet etch rate of the film formed on the sidewalls is equivalent to or lower than that of the film formed on the top surface.

In some embodiments, since the step coverage of film is improved by using two-frequency combined pulsed RF power wherein the RF power, by combining film deposition using the two-frequency combined pulsed RF power and film deposition using two-frequency combined continuous RF power, an air-gap insulation film can be formed while tailoring the thickness of a film formed on the sidewalls and the thickness of a film formed on the top surface, and also tailoring the density or wet etch rate of the film formed on the sidewalls and the density or wet etch rate of the film formed on the top surface.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
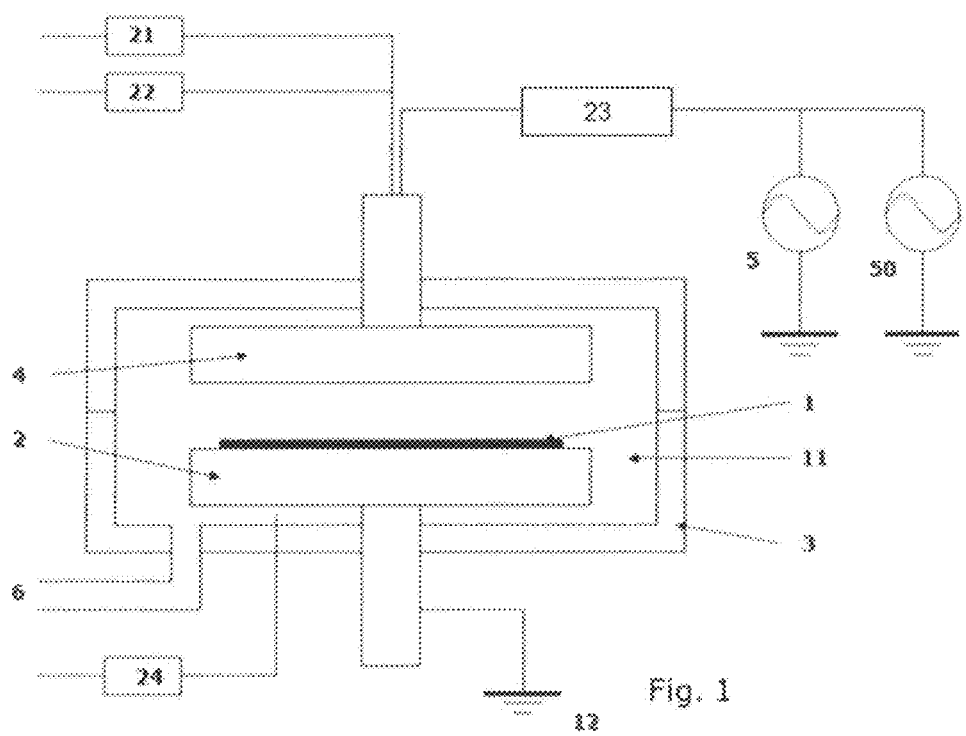
FIG. 1 is a schematic view of a plasma CVD apparatus useable in an embodiment of the present invention.

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead may be comprised of, consist essentially of, or consist of a silicon-containing precursor and an additive gas. The additive gas includes a gas for oxidizing and/or nitriding the precursor when RF power is applied to the additive gas. The precursor and the additive gas can be introduced as a mixed gas or separately to a reaction space. The precursor can be introduced with a carrier gas such as a rare gas. A gas other than the process gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute an workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the disclosure, "continuously" refers to without breaking a vacuum, without interruption as a timeline, without changing treatment conditions, immediately thereafter, as a next step, or without a discrete physical or chemical boundary between two structures, depending on the context, in some embodiments.

Also, in the disclosure, "substantially the same", "substantially uniform", or the like may refer to an immaterial difference or a difference so recognized by a skilled artisan such as those of less than 20%, 10%, less than 5%, less than 1%, or any ranges thereof in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

The present invention includes, but is not limited to, the following embodiments:

1) A method for forming a dielectric film on a substrate by plasma-assisted deposition, comprising: (i) introducing a Si-containing process gas to a reaction space wherein a substrate having a surface with patterned recesses is placed; and (ii) applying RF power to the process gas in the reaction space to form a dielectric film on the surface by plasma reaction, said RF power comprised of pulses of high-frequency RF power and pulses of low-frequency RF power, wherein the pulses of high-frequency RF power and the pulses of low-frequency RF power overlap and are synchronized.

2) The method according to embodiment 1), wherein a duration of each pulse of high-frequency RF power and a duration of each pulse of low-frequency RF power are in a range of approximately 0.1 milliseconds to approximately 100 milliseconds.

3) The method according to embodiment 1) or 2), wherein a duty ratio of each cycle of the pulses of high-frequency RF power and a duty ratio of each cycle of the pulses of low-frequency RF power are approximately 10% to approximately 90% (e.g., approximately 50% or less or approximately 75% or less, preferably less than approximately 70%).

4) The method according to any one of embodiments 1) to 3), wherein a ratio of the high-frequency RF power to the low-frequency RF power is approximately 0.4 to approximately 2.4.

5) The method according to any one of embodiments 1) to 4), wherein the high-frequency RF power has a frequency of approximately 10 MHz to approximately 30 MHz (e.g., approximately 13 MHz), and the low-frequency RF power has a frequency of approximately 200 kHz to approximately 1 MHz (e.g., approximately 430 kHz).

6) The method according to any one of embodiments 1) to 5), wherein the recesses have an aspect ratio of approximately 0.5 to approximately 5.

7) The method according to any one of embodiments 1) to 6), wherein the process gas is introduced to the reaction space continuously.

8) The method according to any one of embodiments 1) to 7), wherein the process gas comprises a Si-containing precursor and an additive gas.

9) The method according to embodiment 8), wherein the Si-containing gas is silane or TEOS.

10) The method according to embodiment 8), wherein the additive gas is at least one gas selected from the group consisting of $N_2$, $H_2$, $O_2$, $NH_3$, $CH_3$, CO, $C_2H_6$, $CO_2$, $N_2O$, Ar, He, and Xe.

11) The method according to any one of embodiments 1) to 10), wherein the dielectric film is constituted by silicon oxide.

12) The method according to any one of embodiments 1) to 11), wherein the dielectric film constitutes air gap structures in the patterned recesses.

13) The method according to embodiment 12), wherein the dielectric film has a thickness of approximately 10 nm to approximately 1000 nm, depending on its intended use.

14) The method according to embodiment 12), wherein the dielectric film is formed as an initial film, and the method further comprises forming a cap film on the initial film by introducing a Si-containing process gas to the reaction space, and applying RF power continuously to the process gas in the reaction space.

15) The method according to embodiment 14), wherein the Si-containing process gas for the cap film is the same as the Si-containing process gas for the initial film.

16) The method according to embodiment 14), wherein the step of forming the initial film and the step of forming the cap film are conducted continuously.

17) The method according to any one of embodiments 1) to 16), wherein the plasma-assisted deposition is plasma-enhanced chemical vapor deposition.

The above embodiments will be explained with respect to the drawings which are not intended to limit the present invention.

FIG. 1 is a schematic view of a plasma CVD apparatus useable in some embodiments of the present invention.

In this example, by providing a pair of electrically conductive flat-plate electrodes 4, 2 in parallel and facing each other in the interior 11 of a reaction chamber 3, applying HRF (high-frequency RF) power 5 and LRF (low-frequency RF) power 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and precursor gas and additive gas are introduced into the reaction chamber 3 through gas flow controllers 21, 22, and the shower plate. Additionally, in the reaction chamber 3, an exhaust pipe 6 is provided, through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). Cyclic deposition can be performed using a pulse flow control valve (not shown) in some embodiments.

HRF power and LRF power can be controlled by a matching box 23, wherein ON/OFF switching of these powers (pulses of the powers) and synchronization of the pulses of these powers can be controlled by the matching box 23.

Figure 6:
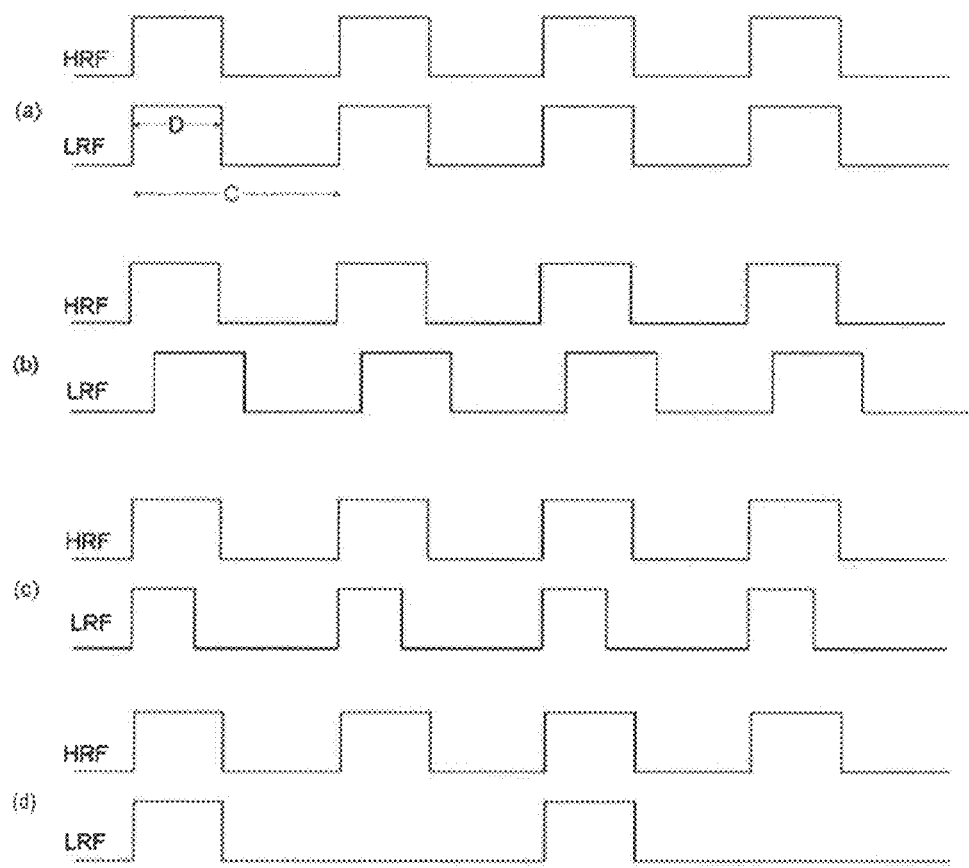
FIG. 6 illustrates synchronizing patterns according to some embodiments of the present invention.

In embodiment 1), the RF power is comprised of pulses of high-frequency RF power and pulses of low-frequency RF power, which overlap and are synchronized. The RF power may comprise additional pulses of different RF powers. In some embodiments, "synchronization" of two pulses refers to the relation that exists when pulses of two cycles overlap continuously according to a pre-selected rule. Also, a "pulse" refers to a cyclic ON state of RF power which is repeated while depositing a film. FIG. 6 illustrates synchronizing patterns according to some embodiments of the present invention. In (a), the timing of pulses of HRF power is completely matched with the timing of pulses of LRF power, wherein the pulses of HRF power and the pulses of LRF power fully overlap. In (b), the duration of each pulse of HRF power is the same as the duration of each pulse of LRF power, and a cycle of the pulses of HRF is the same as a cycle of the pulses of LRF power. However, the pulses of HRF power begin slightly earlier than the pulses of LRF power, wherein the pulses of HRF power and the pulses of LRF power overlap. In (c), the duration of each pulse of HRF power is longer than the duration of each pulse of LRF power, and a cycle of the pulses of HRF is the same as a cycle of the pulses of LRF power. Further, the pulses of HRF power begin simultaneously with the pulses of LRF power, wherein the pulses of HRF power and the pulses of LRF power overlap. In (d), the duration of each pulse of HRF power is the same as the duration of each pulse of LRF power, and the pulses of LRF power begin simultaneously with the pulses of HRF power. However, a cycle of the pulses of LRF is twice the cycle of the pulses of HRF power, wherein the pulses of HRF power and the pulses of LRF power overlap. In some embodiments, any combinations of the above can be employed, wherein HRF and LRF are interchangeable in FIG. 6. In some embodiments, as long as the pulses of HRF power and the pulses of LRF overlap, properties of a film formed on sidewalls can be improved. In some embodiments, the pulses of HRF power and the pulses of LRF overlap by at least 50% of both pulses (in some embodiments, at least 75% or approximately 100%).

A skilled artisan will appreciate that the apparatus includes one or more controller(s) (not shown) programmed or otherwise configured to cause pulsing and synchronization of HRF power and LRF power. The controller(s) are communicated with the various power sources, heating systems, pumps, robotics and gas flow controllers or valves of the reactor, as will be appreciated by the skilled artisan.

In embodiment 2), a duration of each pulse of high-frequency RF power and a duration of each pulse of low-frequency RF power are in a range of approximately 0.1 milliseconds to approximately 1 seconds, preferably approximately 0.1 milliseconds to approximately 100 milliseconds (e.g., 0.1 msec, 0.5 msec, 1 msec, 5 msec, 10 msec, 50 msec, 100 msec, 500 msec, and any number therebetween). Although the duration of RF power (RF ON) for a short cycle ALD process may be 50 msec, by using pulsing function of a plasma generator (capable of setting frequency and duty ratio), a shorter duration of RF power can be realized, and the duration of RF power can be as short as 5 µsec (microseconds). For example, when the frequency of RF power is 10 kHz (i.e., a cycle of 0.1 msec) and the duty ratio is 5%, the duration of RF power is 5 µsec (0.1 msec×0.05) (the RF OFF period is 95 µsec).

In embodiment 3), a duty ratio of each cycle of the pulses of high-frequency RF power and a duty ratio of each cycle of the pulses of low-frequency RF power are 50% or less, preferably approximately 10% to approximately 30%. A duty ratio of each cycle of the pulses of high-frequency RF power and a duty ratio of each cycle of the pulses of low-frequency can be different or the same. The duty ratio refers to a ratio of a period when RF power is ON in one cycle to the duration of one cycle, which is a ratio of D/C as shown in (a) of FIG. 6.

In embodiment 4), a ratio of the high-frequency RF power to the low-frequency RF power is approximately 0.4 to approximately 2.4. In some embodiments, the ratio is less than 2.0 or no more than 1.0. The lower the ratio (i.e., LRF power is higher relative to HRF power), the higher the step coverage and wet etch rate of the resultant film become.

In embodiment 5), the high-frequency RF power has a frequency of approximately 10 MHz to approximately 30 MHz, and the low-frequency RF power has a frequency of approximately 200 kHz to approximately 1 MHz. Typically, the frequency of HRF power is 13.56 MHz or its equivalents, and the frequency of LRF is 430 kHz or its equivalents. In some embodiments, HRF power is in a range of 1 W to 2,000 W (e.g., 50 W to 500 W), and LRF power is in a range of 1 to 2,000 W (e.g., 50 W to 500 W).

In embodiment 6), the recesses have an aspect ratio of approximately 0.5 to approximately 5 (including 1, 2, 3, 4, and any values therebetween). In some embodiments, the properties of the resultant film can improve regardless of the aspect ratio, and thus, the embodiments can apply to any patterned recesses.

In embodiment 7), the process gas is introduced to the reaction space continuously. In embodiment 17), the plasma-assisted deposition is plasma-enhanced chemical vapor deposition (PECVD). Although, typically, the process gas is introduced continuously to the reaction space in PECVD, the process gas can be introduced cyclically to the reaction space in PECVD, wherein either or both of the precursor and the additive gas can cyclically be introduced. Some embodiments can apply to any plasma-assisted deposition including cyclic deposition such as atomic layer deposition (ALD).

In embodiment 8), the process gas comprises a Si-containing precursor and an additive gas, and they can be introduced as a mixed gas or separately to the reaction space.

In embodiment 9), the Si-containing gas is silane or TEOS. Typically, the lower the molecular weight of the precursor, the greater the property improvement of the resultant film formed on sidewalls becomes. Thus, in some embodiments, the precursor has a molecular weight that is less than that of TEOS. However, other materials that can be used include $Si_2H_6$, TSA ($[SiH_3]_3N$), HCDS ($Si_2Cl_6$), $Si_3H_8$, TICS ($Si[NCO]_4$), TBOS ($Si[OtBu]_3OH$), TDMHyS ($Si[NHMe_2]_4$), and aminosilane such as HEAD ($Si_2[NHC_2H_6]_6$), 3DMASCl ($Si[N(CH_3)_2]_3Cl$), among others, depending upon the target dielectric film. One type of precursor may be used alone, or two or more types may be combined together.

In embodiment 10), the additive gas is at least one gas selected from the group consisting of $N_2$, $H_2$, $O_2$, $NH_3$, $CH_3$, CO, $C_2H_6$, $CO_2$, $N_2O$, Ar, He, and Xe (one type of reactant gas may be used alone, or two or more types may be combined together). Depending on the additive gas(es) used, such films as SiN, SiO, SiON, SiCN, SiC, SiCO, SiCON, SiON, SiBN, SiBO, etc. (typically, SiO, SiN, SiON), can be formed. In embodiment 11), the dielectric film is constituted by silicon oxide.

In some embodiments, the plasma processing temperature is typically 600° C. or below or preferably 50 to 550° C., and the pressure is typically 100 Pa to 1,200 Pa, preferably 150 Pa to 600 Pa. The flow rate of precursor is approximately 10 sccm to approximately 500 sccm, preferably approximately 20 sccm to approximately 480 sccm. The flow rate of additive gas is approximately 100 sccm to approximately 10,000 sccm, preferably approximately 100 sccm to approximately 9,000 sccm. The processing time depends upon the thickness of the resultant film formed on sidewalls, and is typically approximately 0.05 minutes to approximately 60 minutes, preferably approximately 0.1 minutes to approximately 1 minutes. In embodiment 13, the dielectric film has a thickness of approximately 10 nm to approximately 10,000 nm, preferably approximately 10 nm to approximately 1,000 mm.

In embodiment 12), the dielectric film constitutes air gap structures in the patterned recesses, although the dielectric film is suitable for any types of film formed on sidewalls as an insulation film or the like. In embodiment 13), the dielectric film is formed as an initial film, and the method further comprises forming a cap film on the initial film by introducing a Si-containing process gas to the reaction space, and applying RF power continuously to the process gas in the reaction space. By combining film deposition for the initial film using the two-frequency combined pulsed RF power and film deposition for the cap film using two-frequency combined continuous RF power, an air-gap insulation film can be formed while tailoring the thickness of a film formed on the sidewalls and the thickness of a film formed on the top surface, and also tailoring the density or wet etch rate of the film formed on the sidewalls and the density or wet etch rate of the film formed on the top surface, wherein the initial film and the cap film constitute an integrated insulation film serving as a single film or a laminated film. In embodiment 16), the film deposition using the two-frequency combined pulsed RF power and the film deposition using two-frequency combined continuous RF power can be conducted continuously in the same reaction chamber. In embodiment 15), the Si-containing process gas for the cap film is the same as the Si-containing process gas for the initial film.

EXAMPLES

Example 1

A dielectric film was formed on a 300-mm substrate having a patterned surface having an aspect ratio of 3.4 and an aspect ratio of 0.8 and an opening width of approximately 50 nm and approximately 230 nm, respectively, under the conditions shown below using the PECVD apparatus illustrated in FIG. 1. HRF and LRF pulse patterns were set as illustrated in (a) of FIG. 6 (100% overlap).

Precursor: $SiH_4$
Precursor inflow pressure: 300 Pa
Precursor flow (continuous): 100 sccm
Additive gas: $N_2O$
Additive gas flow (continuous): 4,000 sccm
Substrate temperature: 400° C.
HRF frequency: 13.56 MHz
HRF power: 300 W
LRF frequency: 430 kHz
LRF power: 300 W
HRF/LRF ON time: 0.3 milliseconds (Duty ratio: 30%)
HRF/LRF OFF time: 0.7 milliseconds (Cycle: 1.0 milliseconds)
Deposition time: 0.5 minutes As a comparative example, a film was formed under the same conditions except that HRF and LRF powers were continuously applied without pulsing. Step coverage of each film was analyzed. The results are shown in FIGS. 2A to 3B.

Figure 2A:
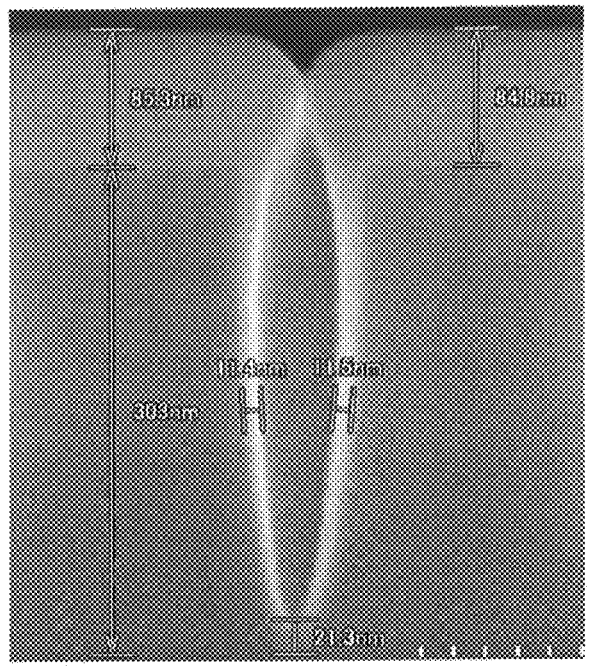
FIG. 2A is a photograph showing a cross section of a patterned recess with a narrow space on which a dielectric film is deposited using two-frequency combined continuous RF power according to a comparative example.
Figure 2B:
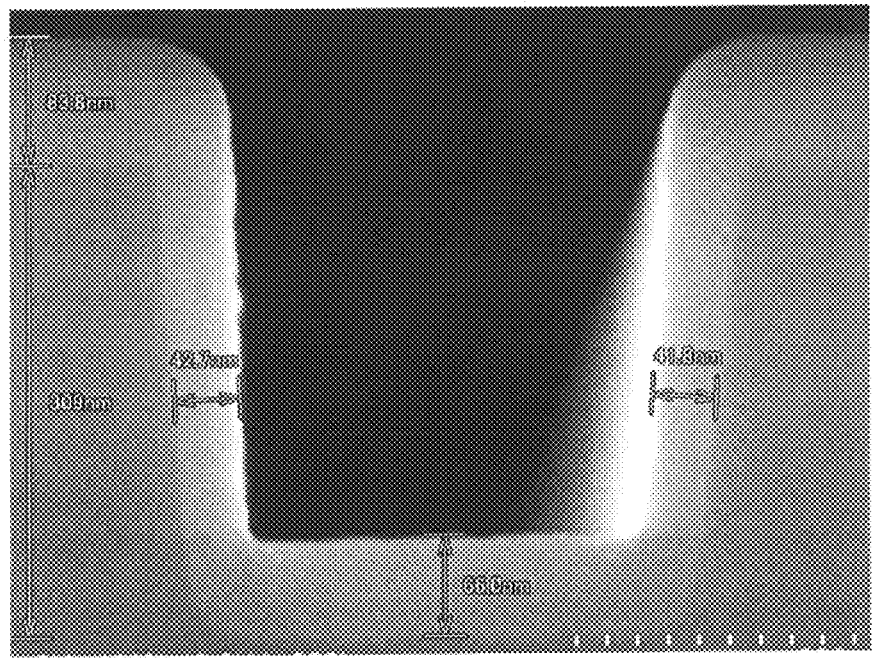
FIG. 2B is a photograph showing a cross section of a patterned recess with a wide space on which a dielectric film is deposited using two-frequency combined continuous RF power according to another comparative example.
Figure 3A:
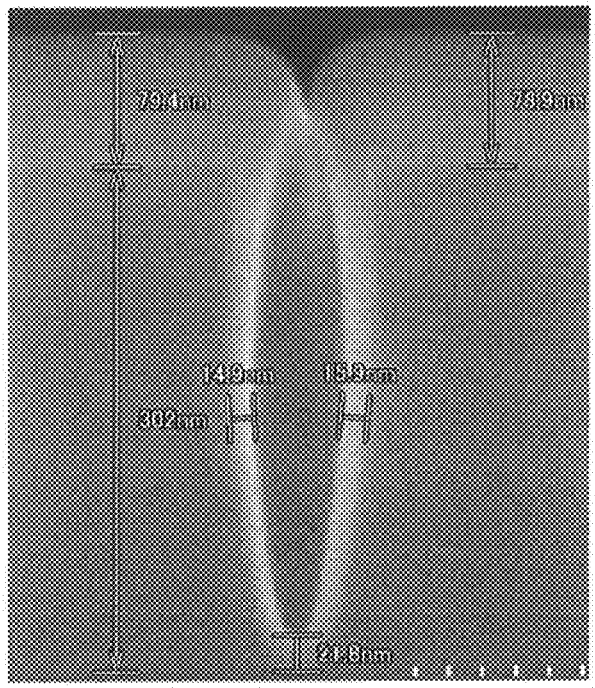
FIG. 3A is a photograph showing a cross section of a patterned recess with a narrow space on which a dielectric film is deposited using two-frequency combined pulsed RF power according to an embodiment of the present invention.
Figure 3B:
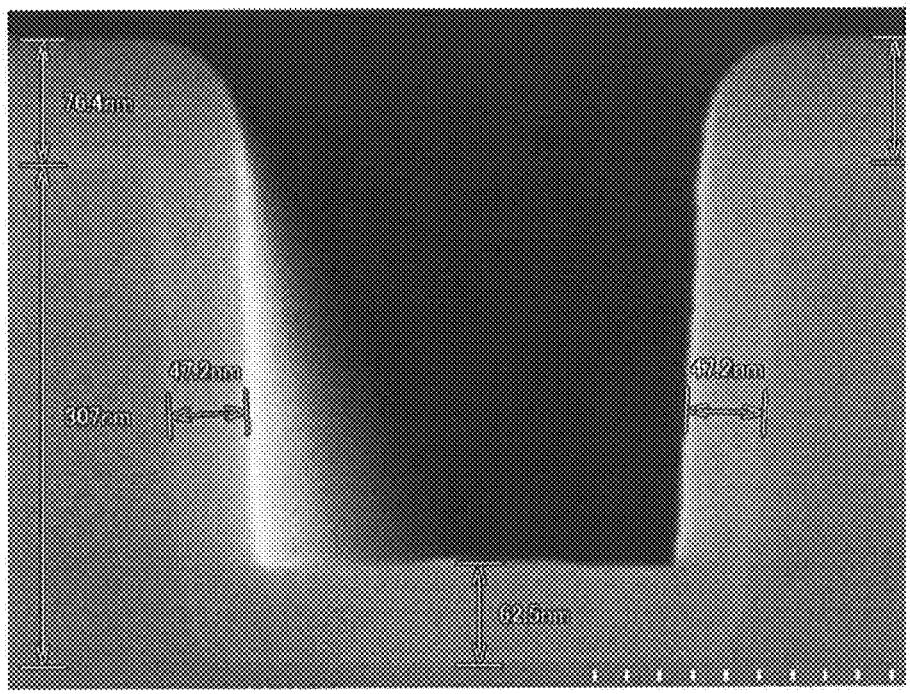
FIG. 3B is a photograph showing a cross section of a patterned recess with a wide space on which a dielectric film is deposited using two-frequency combined pulsed RF power according to another embodiment of the present invention.

FIG. 2A is a photograph showing a cross section of the patterned recess with a narrow space (with an aspect ratio of 3.4, "AR3.4") on which the dielectric film was deposited using the two-frequency combined continuous RF power according to Comparative Example 1. FIG. 2B is a photograph showing a cross section of the patterned recess with a wide space (AR0.8) on which the dielectric film was deposited using the two-frequency combined continuous RF power according to Comparative Example 1. FIG. 3A is a photograph showing a cross section of the patterned recess with a narrow space (AR3.4) on which the dielectric film was deposited using the two-frequency combined pulsed RF power according to Example 1. FIG. 3B is a photograph showing a cross section of the patterned recess with a wide space (AR0.8) on which the dielectric film was deposited using the two-frequency combined pulsed RF power according to Example 1. The measurements are shown in Table 1 below.

TABLE 1

|  | Narrow (AR3.4) | | | Wide (AR0.8) | | |
| --- | --- | --- | --- | --- | --- | --- |
|  | Top [nm] | Side [nm] | Side/Top [%] | Top [nm] | Side [nm] | Side/Top [%] |
| HRF/LRF cont. | 85.1 | 11.5 | 13.5 | 83.8 | 42.3 | 50.4 |
| HRF/LRF pulse | 77.7 | 14.2 | 18.3 | 76.2 | 48.3 | 63.4 |

As can be seen in FIGS. 2A and 2B and Table 1, the step coverage (a ratio in percentage of thickness of film formed on the top surface to thickness of film formed on the sidewalls) in Comparative Example 1 was 13.5% for the air gap of AR3.4 and 50.4% for the air gap of AR0.8. In contrast, as can be seen in FIGS. 3A and 3B and Table 1, the step coverage in Example 1 was 18.3% for the air gap of AR3.4 and 63.4% for the air gap of AR0.8. When using the two-frequency combined pulsed RF power, the step coverage was improved by approximately 5% to approximately 13%, without highly correlating to the aspect ratio.

Example 2

A film was formed in a patterned recess having an aspect ratio of 3.4 (AR3.4) of a substrate under the conditions which were the same as in Example 1 except that the duty ratio and the cycle (a period of one cycle) of HRF and LRF were adjusted as shown in Table 2 below. The step coverage (S/C) of each resultant film is shown in Table 2.

TABLE 2

Step Coverage

| Cycle [msec] | RF-Duty Ratio [%] | | | |
|---|---|---|---|---|
| | 10 | 30 | 50 | 100 |
| cont. | | 13.5% | | |
| 10 | — | 20.9% | — | 13.5% |
| 2 | — | 20.0% | — | 13.5% |
| 1 | 21.9% | 18.9% | 18.3% | 13.5% |
| 0.5 | — | 19.0% | — | 13.5% |
| 0.1 | — | 14.7% | — | 13.5% |

As can be seen in Table 2, the step coverage was improved when using the two-frequency combined pulsed RF power, wherein the longer the cycle, and the smaller the duty ratio, the higher the step coverage improvement became.

Example 3

A film was formed in a patterned recess having an aspect ratio of 3.4 (AR3.4) of a substrate under the conditions which were the same as in Example 1. The obtained film was analyzed with respect to wet etch resistance (etch rate (nm/min) when dipped in a solution of 130 BHF for 60 seconds) of a section of the film deposited on a top surface of the substrate, and of a section of the film deposited on sidewalls. The results are shown in Table 3.

TABLE 3

| | Δ130BHF (Dip Time 60 sec) | | |
|---|---|---|---|
| | Top [nm] | Side [nm] | Side/Top Ratio |
| HRF/LRF cont. | 16.7 | 22.2 | 1.33 |
| HRF/LRF pulse | 25.3 | 21.4 | 0.84 |

As can be seen in Table 3, when the two-frequency combined continuous RF power was used, the film formed on the top surface was hard whereas the film formed on the sidewalls was soft, and thus, the ratio of top wet etch rate to side wet etch rate was as high as 1.33, indicating that the side film was etched significantly faster than the top film. In contrast, when the two-frequency combined pulsed RF power was used, the ratio of top wet etch rate to side wet etch rate was 0.84, indicating that the side film was denser than the top film, and the film quality of the side film was improved. This is likely because by using two-frequency combined pulsed RF power, a side film receives more ion bombardment while being deposited, thereby rendering film properties equivalent to those of a top film, although the present invention is not bound to the theory. A skilled artisan will appreciate that by using two-frequency combined pulsed RF power, the difference in wet etch rate between a top film and a side film can be adjusted by using duty ratio and cycle as control parameters, and a side film having substantially the same density or quality (e.g., the ratio of top wet etch rate to side wet etch rate is approximately 1) as a top film can be obtained via routine experiment based on the present disclosure.

Example 4

Figure 4:
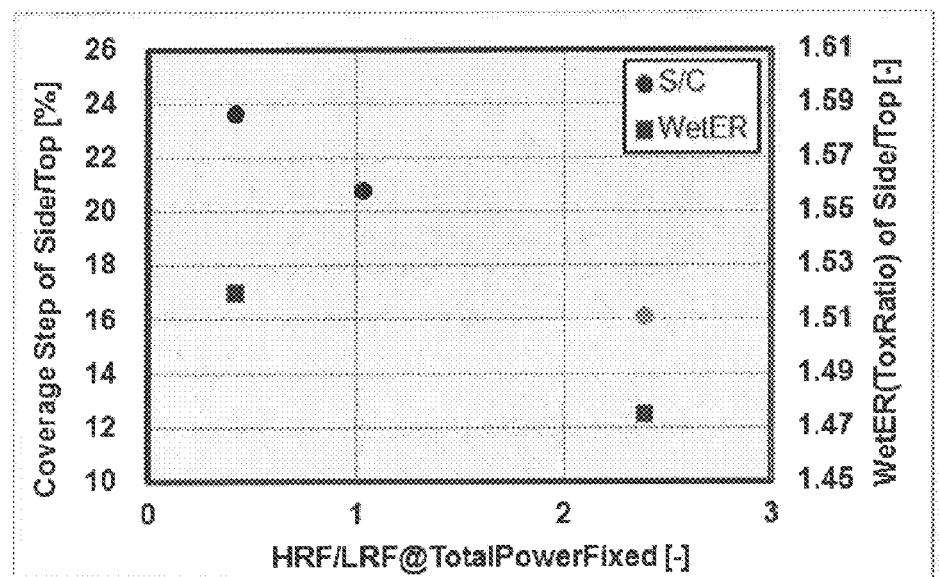
FIG. 4 is a graph demonstrating changes in step coverage (a ratio of step coverage of a side film to step coverage of a top film) and wet etch rate (a ratio of wet etch rate of a side film to wet etch rate of a top film) when changing a ratio of high-frequency RF power (pulsed) to low-frequency RF power (pulsed) according to an embodiment of the present invention.

A film was formed in a patterned recess having an aspect ratio of 3.4 (AR3.4) of a substrate under the conditions which were the same as in Example 1 except that a ratio of HRF power to LRF power was changed without changing the total power (600 W). The obtained film was analyzed with respect to step coverage and wet etch resistance (etch rate (nm/min) when dipped in a solution of 130 BHF for 60 seconds) of a section of the film deposited on a top surface of the substrate, and of a section of the film deposited on sidewalls. The results are shown in FIG. 4. FIG. 4 is a graph demonstrating changes in step coverage (a ratio of step coverage of a side film to step coverage of a top film) and wet etch rate (a ratio of wet etch rate of a side film to wet etch rate of a top film) when changing a ratio of high-frequency RF power (pulsed) to low-frequency RF power (pulsed). As can been seen in FIG. 4, when increasing HRF power relative to LRF power, the thickness of side film increased relative to that of top film, and the wet etch rate of side film increased (becoming more porous) relative to that of top film. Although FIG. 4 demonstrates only a range of 0.4 to 2.4 of HRF/LRF ratio, the step coverage and the wet etch rate are in a tradeoff relationship, and a skilled artisan will be able to select a ratio of HRF power to LRF power depending on the intended use of the film, for example.

Example 5

Figure 5:
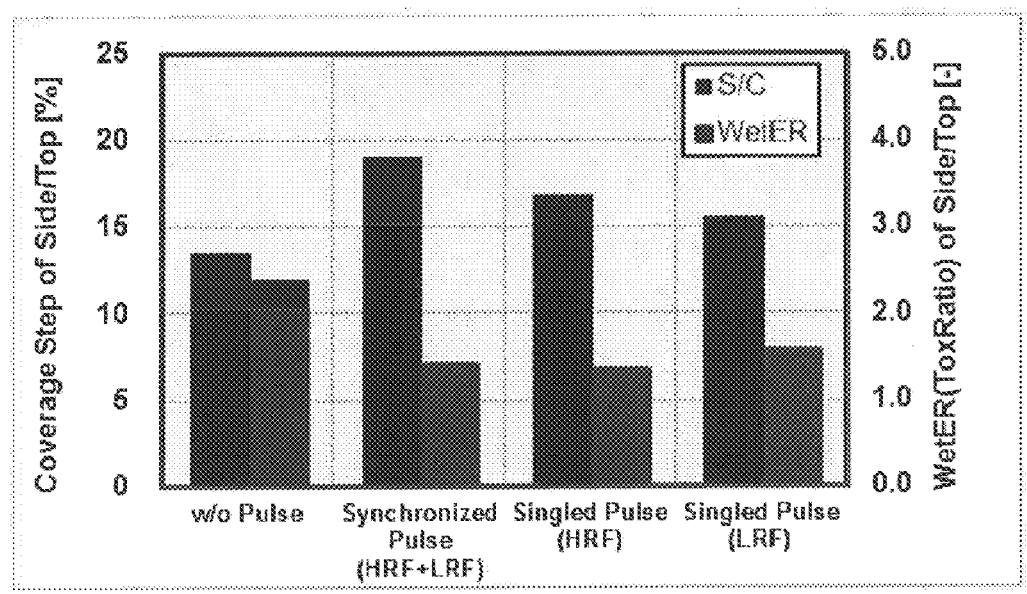
FIG. 5 is a graph demonstrating changes in step coverage (a ratio of step coverage of a side film to step coverage of a top film) and wet etch rate (a ratio of wet etch rate of a side film to wet etch rate of a top film) when changing pulses of high-frequency RF power and low-frequency RF power according to an embodiment of the present invention.

A film was formed in a patterned recess having an aspect ratio of 3.4 (AR3.4) of a substrate under the conditions which were the same as in Example 1 except that pulsing of HRF power and LRF power was changed. The obtained film was analyzed with respect to step coverage and wet etch resistance (etch rate (nm/min) when dipped in a solution of 130 BHF for 60 seconds) of a section of the film deposited on a top surface of the substrate, and of a section of the film deposited on sidewalls. The results are shown in FIG. 5. FIG. 5 is a graph demonstrating changes in step coverage (a ratio of step coverage of a side film to step coverage of a top film) and wet etch rate (a ratio of wet etch rate of a side film to wet etch rate of top film) when changing pulses of HRF power and LRF power. In FIG. 5, the following four combinations were tested:

| Legend | Description |
|---|---|
| w/o Pulse | No pulse: Both HRF and LRF were applied continuously. |
| Synchronized Pulse (HRF + LRF) | Both HRF and LRF were applied in pulses which were synchronized. |
| Single Pulse (HRF) | HRF was applied in pulses; LRF was applied continuously. |
| Single Pulse (LRF) | LRF was applied in pulses; HRF was applied continuosly. |

As can been seen in FIG. 5, when pulsing HRF power and/or LRF power, the wet etch rate of side film decreased (film became denser) relative to that of top film, as compared with continuous HRF/LRF power. By synchronizing pulses of HRF power and LRF power, the thickness of side film increased relative to that of top film, as compared with when only one of or neither of HRF power and LRF power was pulsed. Thus, by synchronizing pulses of HRF power and LRF power, side films having optimal step coverage and density can be obtained.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a dielectric film on a substrate by plasma-assisted deposition, comprising:
   introducing a Si-containing process gas to a reaction space wherein a substrate having a surface with patterned recesses is placed; and
   applying RF power in pulses to the process gas in the reaction space to form a dielectric film on the surface by plasma reaction, said RF power comprised of pulses of high-frequency RF power having a frequency of about 10 MHz to about 30 MHz and pulses of low-frequency RF power having a frequency of about 200 kHz to about 1MHz, wherein the pulses of high-frequency RF power, which is pulsed in cycles, and the pulses of low-frequency RF power, which is pulsed in cycles, overlap and are synchronized, wherein a cycle duration including each pulse of high-frequency RF power and a cycle duration including each pulse of low-frequency RF power are in a range of approximately 0.1 milliseconds to approximately 10 milliseconds,
   each pulse of high-frequency RF power being composed of a plurality of cycles defined by the frequency, each pulse of low-frequency RF power being composed of a plurality of cycles defined by the frequency, wherein a duty ratio of each cycle of the plurality of cycles constituting each pulse of high-frequency RF power and a duty ratio of each cycle of the plurality of cycles constituting each pulse of low-frequency RF power are 75% or less.

2. The method according to claim 1, wherein a ratio of the high-frequency RF power to the low-frequency RF power is approximately 0.4 to approximately 2.4.

3. The method according to claim 1, wherein the recesses have an aspect ratio of approximately 0.5 to approximately 5.

4. The method according to claim 1, wherein the process gas is introduced to the reaction space continuously.

5. The method according to claim 1, wherein the process gas comprises a Si-containing precursor and an additive gas.

6. The method according to claim 5, wherein the Si-containing gas is silane or TEOS.

7. The method according to claim 5, wherein the additive gas is at least one gas selected from the group consisting of $N_2$, $H_2$, $O_2$, $NH_3$, $CH_3$, CO, $C_2H_6$, $CO_2$, $N_2O$, Ar He, and Xe.

8. The method according to claim 1, wherein the dielectric film is constituted by silicon oxide.

9. The method according to claim 1, wherein the dielectric film constitutes air gap structures in the patterned recesses.

10. The method according to claim 9, wherein the dielectric film has a thickness of approximately 10 nm to approximately 1000 nm.

11. The method according to claim 9, wherein the dielectric film is formed as an initial film, and the method further comprises forming a cap film on the initial film by introducing a Si-containing process gas to the reaction space, and applying RF power continuously to the process gas in the reaction space.

12. The method according to claim 11, wherein the Si-containing process gas for the cap film is the same as the Si-containing process gas for the initial film.

13. The method according to claim 11, wherein the step of forming the initial film and the step of forming the cap film are conducted continuously.

14. The method according to claim 1, wherein the plasma-assisted deposition is plasma-enhanced chemical vapor deposition.

15. The method according to claim 1, wherein the duty ratio of each cycle of the pulses of high-frequency RF power and the duty ratio of each cycle of the pulses of low-frequency RF power are about 10% to about 50%.

* * * * *